United States Patent
Wong et al.

[11] Patent Number: 5,847,620
[45] Date of Patent: Dec. 8, 1998

[54] DIELECTRIC RESONATOR PHASE SHIFTING FREQUENCY DISCRIMINATOR

[75] Inventors: Thomas T. Y. Wong, Skokie; Thomas D. Nagode, Chicago; Sabah Khesbak, Arlington Heights, all of Ill.

[73] Assignee: Illinois Institute of Technology, Chicago, Ill.

[21] Appl. No.: 789,815

[22] Filed: Jan. 28, 1997

Related U.S. Application Data

[63] Continuation-in-part of Ser. No. 267,712, Jun. 28, 1994, abandoned.

[51] Int. Cl.$^6$ ........................................................ H03L 7/02
[52] U.S. Cl. ...................... 331/117 D; 331/9; 333/219.1; 333/120
[58] Field of Search ................................ 329/322; 331/99, 331/117 D, 9, 6; 333/116, 120, 219.1

[56] References Cited

U.S. PATENT DOCUMENTS

| | | | |
|---|---|---|---|
| 3,136,950 | 6/1964 | Mackey . | |
| 3,529,259 | 9/1970 | Holmes et al. | 331/12 |
| 3,599,323 | 8/1971 | Saxena | 29/590 |
| 3,702,971 | 11/1972 | Kawamoto et al. | 330/57 |
| 4,780,691 | 10/1988 | Fiedziuszko | 331/9 |
| 4,835,498 | 5/1989 | Rouger et al. | 333/205 |
| 4,855,691 | 8/1989 | Argintaru et al. | 331/172 |
| 4,881,051 | 11/1989 | Tang et al. | 333/208 |
| 5,077,545 | 12/1991 | Gopani et al. | 333/195 |
| 5,079,524 | 1/1992 | Sugawara | 331/96 |
| 5,150,080 | 9/1992 | Bianchini et al. | 331/99 |
| 5,194,834 | 3/1993 | Bacher et al. | 333/81 A |
| 5,227,748 | 7/1993 | Sroka | 333/207 |
| 5,233,318 | 8/1993 | Mizan et al. | 333/219.1 |

OTHER PUBLICATIONS

Pound, R.V., "Electronic Frequency Stabilization of Microwave Oscillators," Review of Scientific Instruments, vol. 17, No. 11, pp. 490–505, 1946.

Otobe et al, A low drift oscillator stabilized by a highly discriminator, pp. 319–324, 1983.

Doust et al, Satellite multiplexing using dielectric resonator filters, pp. 93–106, Dec. 1989.

*Primary Examiner*—Robert J. Pascal
*Assistant Examiner*—David H. Vu
*Attorney, Agent, or Firm*—Speckman Pauley Petersen & Fejer

[57] ABSTRACT

A dielectric resonator frequency discriminator comprising a microstrip, a single mode dielectric resonator coupled to the microstrip, at least one detector for detecting an RF signal coupled to the microstrip and an RF input for introducing an RF signal coupled to the microstrip.

22 Claims, 6 Drawing Sheets

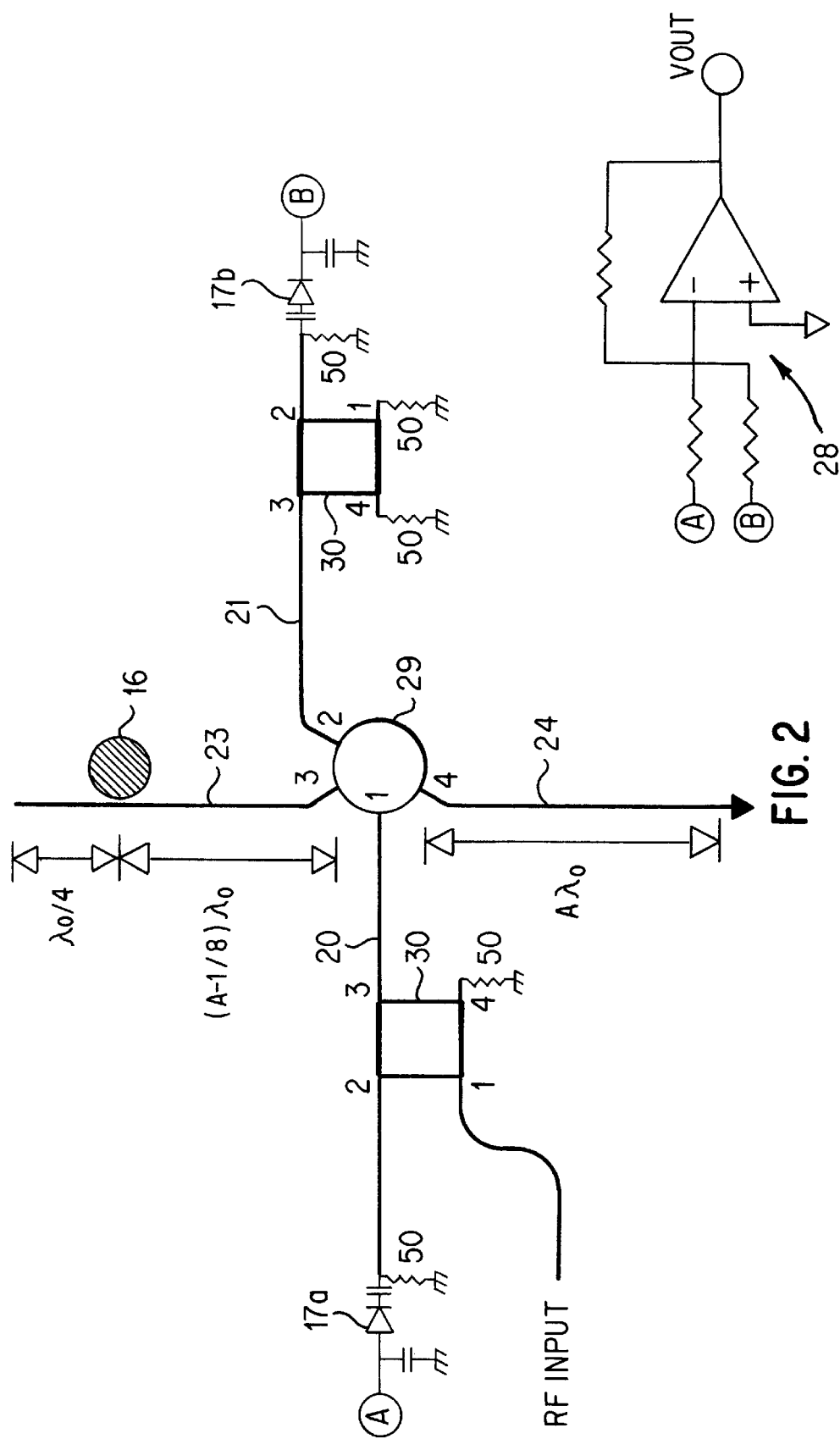

DIELECTRIC RESONATOR PHASE SHIFTING FREQUENCY DISCRIMINATOR

CROSS REFERENCE TO RELATED APPLICATION

This application is a Continuation-in-Part application of our application having Ser. No. 08/267,712, filed 28 Jun. 1994 now abandoned.

BACKGROUND OF THE INVENTION

1. Field of the Invention

This invention relates to an electronic circuit for a Pound-type frequency discriminator. The basic Pound-type frequency discriminator employs a waveguide/cavity resonator approach to frequency discrimination. The electronic circuit of this invention employs a microstrip/dielectric resonator approach which is less costly and more compact than a waveguide/cavity resonator.

2. Brief Description of the Prior Art

The basic Pound-type frequency discriminator which employs a waveguide/cavity resonator approach to frequency discrimination is described in Pound, R. V., "Electronic Frequency Stabilization of Microwave Oscillators," *Review of Scientific Instruments*, Vol. 17, No. 11, pp. 490–505, (1946). The stabilization circuits disclosed by this reference employ a microwave circuit formed from "Magic Tees", that is, a four-branch waveguide assembly that correctly terminates branches with effects of energy transfer from one branch to two others, usually equally.

U.S. Pat. No. 5,077,545 teaches a surface acoustic wave waveguide-coupled resonator filter embedded in a bridged-T allpass circuit to provide a pair of equal capacitances of the circuit. The resonator ground is connected to one terminator of the parallel inductor of the circuit, the other terminal of which is connected to a system ground.

The use of a dielectric resonator in combination with microstrip technology for use as a frequency discriminator is generally known. U.S. Pat. No. 4,780,691 teaches a frequency discriminator comprising a two-mode dielectric resonator disposed within a housing which is excited by an RF input and, subsequently, generates in response to the excitation first and second orthogonal modes of RF electromagnetic energy at slightly different frequencies. The two orthogonal modes are converted to D.C. output signals of opposite polarity and substantially the same magnitude by diodes. Frequency offsets are obtained by tuning screws and/or by changing the amount of dielectric in the path of the characterizing vector corresponding to the mode being frequency-offset.

A single-mode cavity resonator in a discriminator circuit for stabilizing the frequency of VHF and UHF signal generating systems is taught by U.S. Pat. No. 3,529,259. The design of this circuit utilizes a transmission cavity resonator which is coupled to the rest of the circuit by two transmission lines, The action of the resonator is conveyed by the signal transmitted through the resonator. The resonator and associated transmission lines form a 2-port element. Otobe et al., "A Low Drift Oscillator Stabilized by a Highly Sensitive Discriminator," Sony Research Center, Hodogaya-ku, Yokohama, Japan, 1983, pp. 319–324, teaches a low-drift oscillator stabilized by a highly sensitive discriminator consisting of a dual-gate FET and a dielectric resonator. The dielectric resonator is coupled to two microstrips and, thus, functions as two-port circuit element.

The use of dielectric resonator filters in a microwave multiplexer having four inputs, each with a specific passband frequency to accommodate the requirement of the corresponding communication channel, for combining four channels of microwave signals and delivering the combined signal at the output is taught by Doust et al., "Satellite Multiplexing Using Dielectric Resonator Filters," *Microwave Journal*, December 1989, pp. 93–106. U.S. Pat. No. 4,881,051 teaches a dielectric image-resonator multiplexer for use in satellite communications. The application of a dielectric resonator to frequency stabilization of a solid-state microwave oscillator, a device significantly different from a frequency discriminator in that it typically has only one output, the oscillator signal output at microwave frequency, and neither accepts an external microwave signal nor delivers a DC voltage, as in the case of frequency discriminators, is taught by U.S. Pat. No. 5,079,524.

U.S. Pat. No. 5,233,319 teaches a tunable dielectric resonator oscillator having a resonance structure including a metal cavity in which a dielectric disk is centrally mounted by a low-loss dielectric post and a pair of microstrip transmission lines which extend into the cavity to provide energy outputs and inputs. Dielectric and conductive tuning screws are mounted on the cavity walls. Electrical tuning is provided by means of a varactor diode whose bias is adjustable. The diode may be connected in serial or parallel with the microstrip transmission line.

U.S. Pat. No. 4,835,498 teaches a tunable microwave filtering device having a dielectric resonator coupled to a microstrip line, a coplanar line capable of being coupled to the resonator, and an active element, such as a varactor, mounted on the coplanar line, the variable impedance of which enables the frequency tuning of the device.

U.S. Pat. No. 4,855,691 teaches a microwave frequency discriminator having an inlet microstrip line, two resonance circuits constituted by dielectric resonators and coupled to the inlet microstrip to receive a modulated microwave signal, and two outlet microstrip lines coupling each resonator to a respective microwave detector circuit, which detector circuits include loads in series-opposition in the manner of a Travis discriminator.

Finally, U.S. Pat. No. 5,150,080 teaches an oscillator including an amplifier having an input and an output and a feedback circuit disposed between the input and the output of the amplifier. The feedback circuit includes a plurality of resonators and a pair of switches, each switch including a first port and multiple connectable ports, the multiple connecting ports of each switch connected to a corresponding one of the resonators. The feedback circuit further includes a voltage-controlled phase shifter disposed in series with the switches. A discriminator circuit, responsive to signals from the feedback circuit, provides a control signal to the voltage-controlled phase shifter for degenerating low frequency noise within the oscillator. As a result, high Q low noise resonators can be switched in and out of the circuit, thereby providing improved phase noise performance at high power levels with a desirable frequency agility required by a microwave oscillator.

Over the years, the Pound discriminator has been used for frequency stabilization of waveguide oscillators, phase lock loops, and frequency synthesizers. As a result of this invention, this discriminator can now be realized on a microstrip with the use of a dielectric resonator. The microstrip/dielectric resonator approach, as stated previously, is less costly and more compact than the waveguide/cavity resonator approach, nevertheless maintaining similar performance.

SUMMARY OF THE INVENTION

It is an object of this invention to provide an electronic circuit for a Pound-type frequency discriminator having performance characteristics similar to Pound-type frequency discriminators employing a waveguide/cavity resonator approach to frequency discrimination.

It is another object of this invention to provide an electronic circuit for a Pound-type frequency discriminator which is less costly and more compact than known waveguide/cavity resonators employed for frequency discrimination.

These and other objects of this invention are attained by a dielectric resonator frequency discriminator in accordance with one embodiment of this invention comprising a microstrip, a single-mode dielectric resonator coupled to the microstrip, said single-mode dielectric resonator functioning as a one-port element, at least one detector means for detecting an RF signal coupled to the microstrip, and RF input means for introducing an RF signal into the frequency discriminator coupled to the microstrip.

In accordance with a particularly preferred embodiment of this invention, the microstrip is T-shaped, having a base leg and two arms. The single mode dielectric resonator is coupled to the base leg of the microstrip and one of the detector means is coupled to each of the arms, the detector means being a matched set. For example, in accordance with one embodiment of this invention, the detector means comprises at least one hot-carrier diode; thus, a matched pair of hot-carrier diodes are coupled to said arms of said T-shaped microstrip. Alternatively, point contact diodes or high speed detector diodes may be used as RF signal detectors.

BRIEF DESCRIPTION OF THE DRAWINGS

These and other features and objects of this invention will be better understood from the following detailed description taken in conjunction with the drawings wherein:

FIG. 2 is a schematic diagram of an electronic circuit for a dielectric resonator frequency discriminator in accordance with another embodiment of this invention;

FIG. 2a is a schematic diagram of an operational amplifier for use in connection with the circuit shown in FIG. 2;

DESCRIPTION OF PREFERRED EMBODIMENTS

Figure 1:
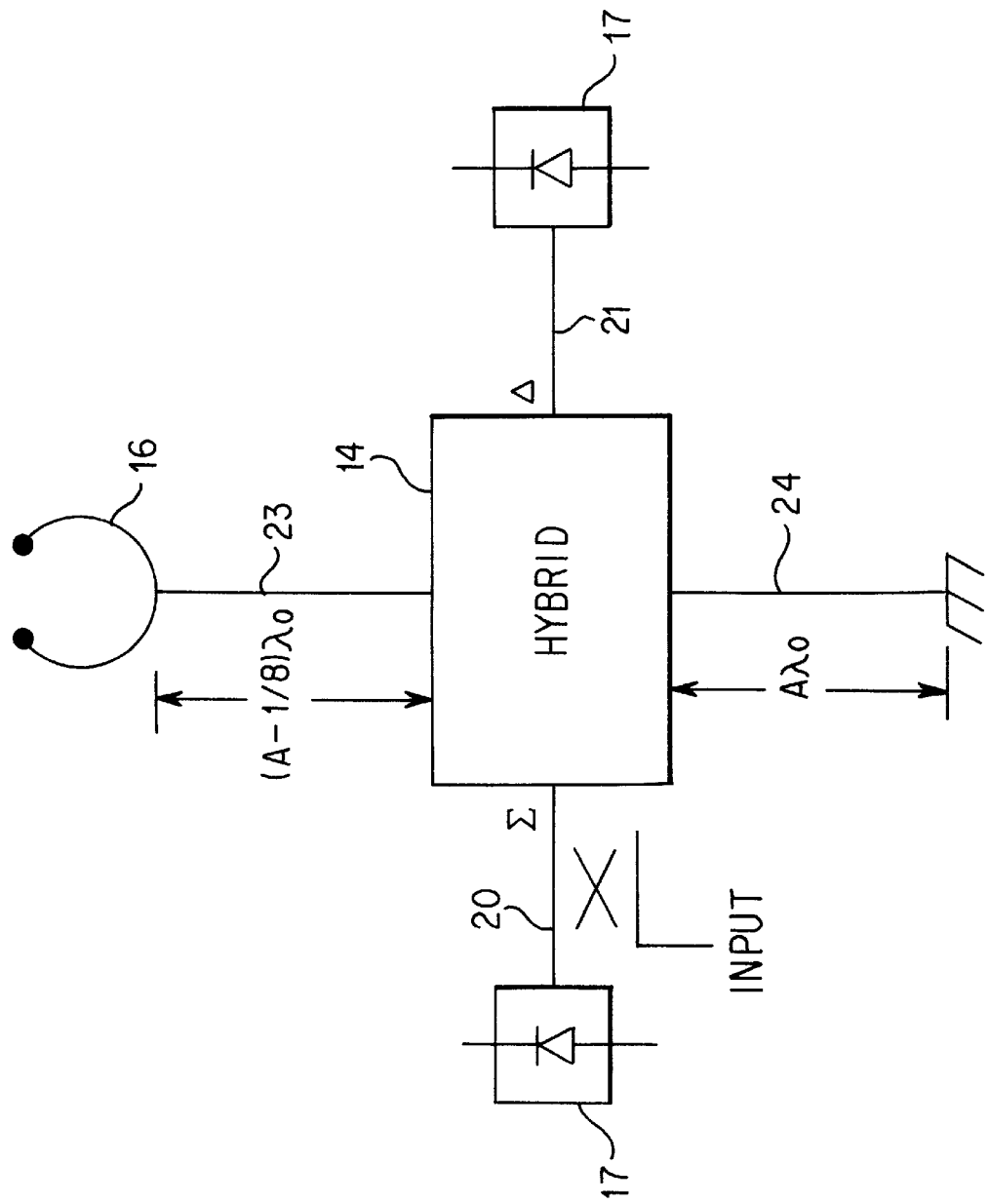
FIG. 1 is a schematic diagram of a dielectric resonator frequency discriminator circuit in accordance with one embodiment of this invention.

FIG. 1 shows a block diagram of a Pound-type discriminator according to one embodiment of this invention comprising hybrid 14, single mode dielectric resonator 16 connected to a transmission line in the form of resonator arm 23 having length $(A-\frac{1}{8})\lambda_o$, short-circuited stub arm 24 of length $A\lambda_o$ and a matched pair of RF detectors 17, one of which is connected to sum arm 20 and the other of which is connected to difference arm 21. The microstrip equivalence of the block diagram shown in FIG. 1 is shown in FIG. 2. An electronic circuit for a dielectric resonator frequency discriminator in accordance with one embodiment of this invention as shown in FIG. 2 comprises hybrid ring (rat-race coupler) 29 having four branch arms, resonator arm 23, sum arm 20, difference arm 21, and short-circuited stub arm 24, connected at terminals 3, 1, 2, and 4, respectively. Single mode dielectric resonator 16 is coupled to resonator aim 23 at a distance $(A-\frac{1}{8})\lambda_o$ from hybrid ring 29. Single mode dielectric resonator 16 is magnetically coupled to resonator arm 23. Coupled to each of sum arm 20 and difference arm 21 are microstrip couplers 30a and 30b in the form of 3 dB branch line directional couplers. RF input to the circuit is through microstrip coupler 30a connected to sum arm 20. Microstrip coupler 30b connected to difference arm 21 is provided to obtain a power level balance at RF detector means 17 when operating the circuit at the resonant frequency of single mode dielectric resonator 16. As shown in FIG. 2, RF detector means 17 are preferably hot-carrier diodes.

Operation of the electronic circuit for a single mode dielectric resonator frequency discriminator in accordance with the embodiment shown in FIG. 2 is as follows. An RF signal is injected through microstrip coupler 30a connected to sum arm 20 into sum arm 20 of hybrid ring 29. Hybrid ring 29 outputs two signals of equal strength and phase to resonator arm 23 and short-circuited stub arm 24. The signals in resonator arm 23 and short-circuited stub arm 24 are then reflected back into hybrid ring 29. The sum and difference of the reflected signals are output to sum arm 20 and difference arm 21, respectively. Thereafter, the sum and difference RF signals are detected by detector means 17 and added together by differential amplifier 28 as shown in FIG. 2a which outputs the amplified difference of the detected signals.

The following analysis of the circuit of this invention assumes a lossless case, ideal couplers, and only considers phase terms where appropriate. The analysis begins with the S-parameters for the directional microstrip coupler 30a and hybrid ring 29.

The S-parameter matrix for the 3 dB directional microstrip coupler 30a is:

$$[S_c] = \frac{1}{\sqrt{2}} \begin{vmatrix} 0 & 0 & 1 & j \\ 1 & 0 & j & 1 \\ 1 & j & 0 & 0 \\ j & 1 & 0 & 0 \end{vmatrix} \quad (1)$$

where ports 1, 2, 3 and 4 of the microstrip coupler 30a are shown in FIG. 2. It should be noted that the phase term introduced by the directional microstrip coupler 30a is neglected because it does not affect the results of the analysis. Thus, the S-parameter matrix for the directional microstrip coupler 30a becomes:

$$[S_c] = \frac{1}{\sqrt{2}} \begin{vmatrix} 0 & 0 & 1 & 1 \\ 0 & 0 & 1 & 1 \\ 1 & 1 & 0 & 0 \\ 1 & 1 & 0 & 0 \end{vmatrix} \quad (2)$$

The S-parameter matrix for hybrid ring 29 is:

$$[S_h] = \frac{1}{\sqrt{2}} \begin{vmatrix} 0 & 0 & 1 & 1 \\ 0 & 0 & 1 & -1 \\ 1 & 1 & 0 & 0 \\ 1 & -1 & 0 & 0 \end{vmatrix} \tag{3}$$

where terminals 1, 2, 3 and 4 of hybrid ring 29 are shown in FIG. 2.

The analysis is simplified by using phaser notation, that is, $v(t) = \text{Re}\{V \exp(-jwt)\}$, where V may be a complex number.

Applying a signal, V=1 volt, to the input of microstrip coupler 30a produces a signal of $$V_{c3} = \frac{1}{\sqrt{2}} \tag{4}$$

This signal is applied to sum arm 20 of hybrid ring 29 and outputs a signal of $$V_{h3} = V_{h4} = \frac{1}{2} \tag{5}$$

to resonator arm 23 and short-circuited stub arm 24.

The output signal in resonator arm 23 is reflected back into hybrid ring 29 having a reflection coefficient of $\Gamma_1(f)$. As a consequence of Equation 3, a signal of $$V_{h1}^{(1)} = V_{h2}^{(1)} = \frac{1}{2\sqrt{2}} \Gamma_1(f) \tag{6}$$

is output at both sum arm 20 and difference arm 21 of hybrid ring 29.

Similarly, the signal output from hybrid ring 29 at short-circuited stub arm 24 is also reflected back into hybrid ring 29, but with a reflection coefficient of $\Gamma_2(f)$. As a consequence of Equation 3, the signals of $$V_{h1}^{(2)} = \frac{1}{2\sqrt{2}} \Gamma_2(f) \tag{7}$$

and $$V_{h2}^{(2)} = -\frac{1}{2\sqrt{2}} \Gamma_2(f) \tag{8}$$

also appear at the output at sum arm 20 and difference arm 21, respectively. Thus, the total signal output at sum arm 20 is the sum of Equations 6 and 7:

$$V_{h1} = V_{h1}^{(1)} + V_{h1}^{(2)} = \frac{1}{2\sqrt{2}} \{\Gamma_1(f) + \Gamma_2(f)\} \tag{9}$$

Similarly, the total signal output at difference arm 21 is the sum of Equations 6 and 8:

$$V_{h2} = V_{h2}^{(1)} + V_{h2}^{(2)} = \frac{1}{2\sqrt{2}} \{\Gamma_1(f) - \Gamma_2(f)\} \tag{10}$$

The sum and difference signals then pass through directional microstrip couplers 30a and 30b. As a consequence of Equation 2, the signal appearing at sum detector 17a is $$V_{sum} = \frac{1}{4} \{\Gamma_1(f) + \Gamma_2(f)\} \tag{11}$$

while the signal at difference arm detector 17b is $$V_{diff} = \frac{1}{4} \{\Gamma_1(f) - \Gamma_2(f)\} \tag{12}$$

The output voltage of a true square-law detector is proportional to the detected power level in dB. The power levels in dB applied to sum arm detector 17a and difference arm detector 17b are, respectively, $$V_{DET-S} = B \, 20 \, \text{LOG} \left\{ \frac{1}{4} \right\} + B \, 20 \, \text{LOG}\{|\Gamma_1(f) + \Gamma_2(f)|\} \tag{13}$$

and $$V_{DET-D} = B \, 20 \, \text{LOG} \left\{ \frac{1}{4} \right\} + B \, 20 \, \text{LOG}\{|\Gamma_1(f) - \Gamma_2(f)|\} \tag{14}$$

where B is the gain of the detector.

The output voltage of the difference amplifier 28 is $$\begin{aligned} V_{out} &= C\{V_{DET-D} - V_{DET-S}\} \\ &= C \, 20 \, \text{LOG} \left\{ \frac{|\Gamma_1(f) - \Gamma_2(f)|}{|\Gamma_1(f) + \Gamma_2(f)|} \right\} \end{aligned} \tag{15}$$

where C is the overall gain of the detector and difference amplifier 28 shown in FIG. 2.

The expressions for $\Gamma_1(f)$ and $\Gamma_2(f)$ are determined as follows. The reflection coefficient of a transmission line of length d and terminated with a load impedance $Z_r$ is expressed as $$\Gamma = \frac{Z_\Gamma - Z_o}{Z_\Gamma + Z_o} e^{-2\gamma d} \tag{16}$$

where $Z_0$ is the characteristic impedance and $\gamma$ is the propagation constant. For the lossless case, the propagation constant, $\gamma$, is $$\gamma = j\beta = j\frac{2\pi f}{v} = j\frac{2\pi}{\lambda} \tag{17}$$

where f is the operating frequency, v is the phase velocity of the transmission line, and $\lambda$ is the wavelength at operating frequency f. Accordingly, the reflection coefficient is written as $$\Gamma = \left\{ \frac{1 - \frac{Z_o}{Z_\Gamma}}{1 + \frac{Z_o}{Z_\Gamma}} \right\} e^{-j\frac{4\pi}{\lambda} d} = \left\{ \frac{1-y}{1+y} \right\} e^{-j\frac{4\pi}{\lambda} d} \tag{18}$$

where y is the normalized load admittance.

To determine $\Gamma_1(f)$, an equivalent circuit of the dielectric resonator, which is coupled to a transmission line of length $d=(A-\frac{1}{8})\lambda_0$, is used.

Figure 6:
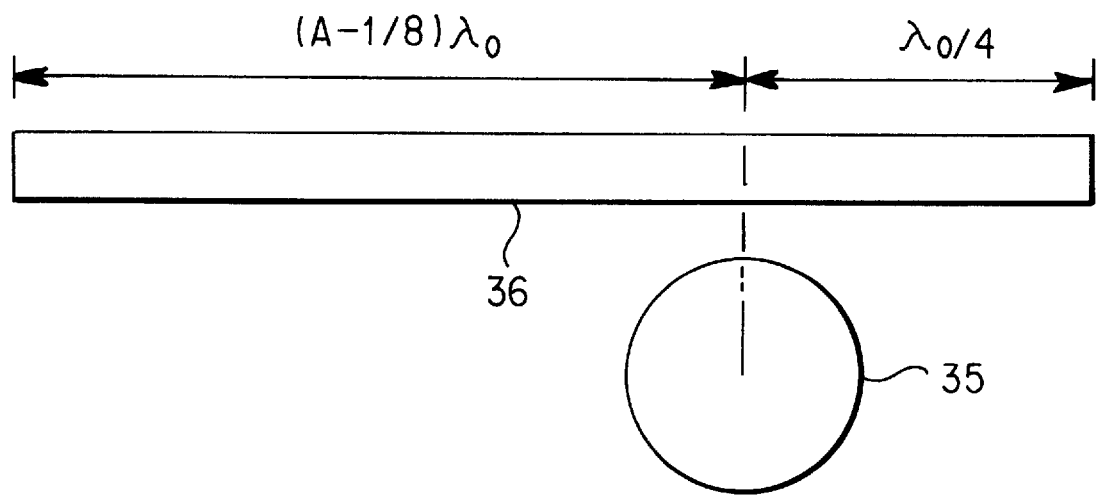
FIG. 6 is a schematic diagram showing a dielectric resonator coupled to a microstrip in accordance with one embodiment of the electronic circuit of this invention.

The equivalent circuit of a dielectric resonator magnetically coupled to a microstrip line is a parallel RLC tank circuit connected in series to the microstrip line. The RLC values are determine by the unloaded quality factor $Q_u$ and the coupling factor k ($k=R/Z_0$). Thus, the microstrip circuit shown in FIG. 6 with dielectric resonator 35 coupled to microstrip 36 can be represented by the circuit shown in FIG. 7.

Figure 7:
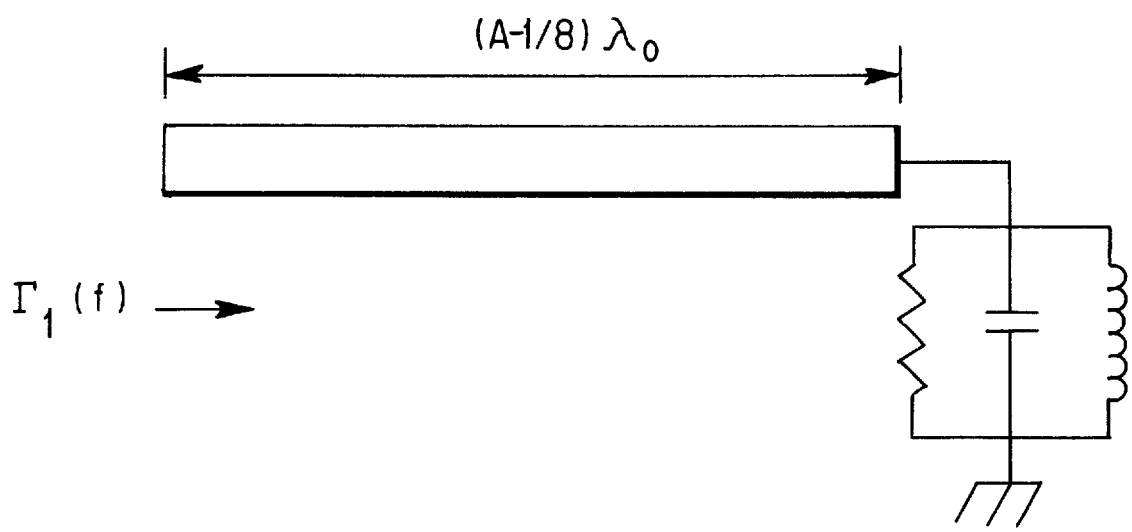
FIG. 7 is a schematic diagram of an equivalent circuit of the circuit shown in FIG. 6.

The normalized admittance of the circuit shown in FIG. 7 can be expressed as $$y = \frac{Z_o}{Z_\Gamma} = \frac{Z_o}{R} + jZ_o \left( \omega C - \frac{1}{\omega L} \right) \tag{19}$$

where $\omega = 2\pi f$ and f is the operating frequency.

The unloaded Q of the dielectric resonator 35 can be expressed in terms of its equivalent circuit as $$Q_u = \frac{R}{\omega_o L} = \omega_o CR \tag{20}$$

where $\omega_0=2\pi f_0$ and $f_0$ is the resonant frequency of dielectric resonator 35. Therefore, the inductance and capacitance values are as follows:

$$L = \frac{R}{\omega_o Q_u} = \frac{R}{2\pi f_o Q_u} = \frac{kZ_o}{2\pi f_o Q_u} \tag{21}$$

and $$C = \frac{Q_u}{\omega_o R} = \frac{Q_u}{2\pi f_o R} = \frac{Q_u}{2\pi f_o k Z_o} \tag{22}$$

where the coupling factor k of the microstrip line is defined as $$k = \frac{R}{Z_o} \tag{23}$$

Substituting Equations 21, 22, and 23 into Equation 19 produces $$\frac{Z_o}{Z_\Gamma} = \frac{1}{k} + j\frac{Q_u}{k}\left(\frac{f}{f_o} - \frac{f_o}{f}\right) \tag{24}$$

Where the length d of microstrip 36 is given as $d=(A-\frac{1}{8})\lambda_0$ and $$\frac{\lambda_o}{\lambda} = \frac{f}{f_o} \tag{25}$$

the reflection coefficient, $\Gamma_1(f)$, is expressed as $$\Gamma_1(f) = \left\{ \frac{1 - \frac{1}{k} - j\frac{Q_u}{k}\left(\frac{f}{f_o} - \frac{f_o}{f}\right)}{1 + \frac{1}{k} + j\frac{Q_u}{k}\left(\frac{f}{f_o} - \frac{f_o}{f}\right)} \right\} e^{-j4\pi\left(A - \frac{1}{8}\right)\frac{f}{f_o}} \tag{26}$$

When $Q_u$ is large, the operational bandwidth is small and $f/f_0 \cong 1$ over the bandwidth of operation. Therefore, $\Gamma_1(f)$ is approximated by $$\Gamma_1(f) \cong \left\{ \frac{1 - \frac{1}{k} - j\frac{Q_u}{k}\left(\frac{f}{f_o} - \frac{f_o}{f}\right)}{1 + \frac{1}{k} + j\frac{Q_u}{k}\left(\frac{f}{f_o} - \frac{f_o}{f}\right)} \right\} e^{-j4\pi\left(A - \frac{1}{8}\right)} \tag{27}$$

Increasing the length of the transmission line by $\lambda_0/2$ produces $$\Gamma_1(f) \cong \left\{ \frac{1 - \frac{1}{k} - j\frac{Q_u}{k}\left(\frac{f}{f_o} - \frac{f_o}{f}\right)}{1 + \frac{1}{k} + j\frac{Q_u}{k}\left(\frac{f}{f_o} - \frac{f_o}{f}\right)} \right\} e^{-j4\pi\left(A - \frac{3}{8}\right)} \tag{28}$$

Thus, it is apparent that the length of resonator arm 23 which is coupled to a high $Q_u$ dielectric resonator 16 as shown in FIG. 2 may be adjusted by any small multiple $\lambda_0/2$ without appreciably affecting its input reflection coefficient over the frequency of operation.

Equation 28 can be simplified, resulting in $$\Gamma_1(f) \cong M(f) e^{-j\left[4\pi\left(A + \frac{3}{8}\right) \Phi(f)\right]} \tag{29}$$

where $$M(f) = \left\{ \frac{\{k-1\}^2 + \left\{Q_u\left(\frac{f}{f_o} - \frac{f_o}{f}\right)\right\}^2}{\{k+1\}^2 + \left\{Q_u\left(\frac{f}{f_o} - \frac{f_o}{f}\right)\right\}^2} \right\}^{1/2} \tag{30}$$

and $$\Phi(f) = \arctan\left\{\frac{\left\{Q_u\left(\frac{f_o}{f} - \frac{f}{f_o}\right)\right\}}{\{k-1\}}\right\} + \arctan\left\{\frac{\left\{Q_u\left(\frac{f_o}{f} - \frac{f}{f_o}\right)\right\}}{\{k-1\}}\right\} \tag{31}$$

The limits on M(f) and $\phi$(f) are $$\frac{k-1}{k+1} \leq M(f) < 1 \tag{32}$$

and $$-180° < \phi(f) < 180° \tag{33}$$

Similarly, the reflection coefficient of short-circuited stub arm 24 having length $d=A\lambda_0$ is expressed as $$\Gamma_2(f) = -e^{-j4\pi A \frac{\lambda_o}{\lambda}} = -e^{-j4\pi A \frac{f}{f_o}} \cong -e^{-j4\pi A} \tag{34}$$

Solving for the magnitude of the sum of the reflection coefficients results in $$|\Gamma_1(f) + \Gamma_2(f)| \cong \left|M(f)e^{-j\left[4\pi\left(A + \frac{3}{8}\right) - \Phi(f)\right]} - e^{-j4\pi A}\right| \tag{35}$$

$$\cong \left|M(f)e^{-j\left[\frac{3}{2}\pi - \Phi(f)\right]} - 1\right| |e^{-j4\pi A}|$$

$$\cong \left|1 - M(f)e^{j\left[\frac{1}{2}\pi + \Phi(f)\right]}\right|$$

Similarly, $$|\Gamma_1(f) + \Gamma_2(f)| \cong \left|1 - M(f)e^{j\left[\frac{\pi}{2} + \Phi(f)\right]}\right| \tag{36}$$

Substituting Equations 35 and 36 into Equation 15 produces $$V_{out} = C \, 20 \, LOG \left\{ \frac{\left|1 + M(f)e^{j\left[\frac{\pi}{2} + \Phi(f)\right]}\right|}{\left|1 - M(f)e^{j\left[\frac{\pi}{2} + \Phi(f)\right]}\right|} \right\} \tag{37}$$

It is apparent from this analysis that $V_{out}$ is not a function of "A". Therefore, "A" can be set to any positive real value.

Figure 3A:
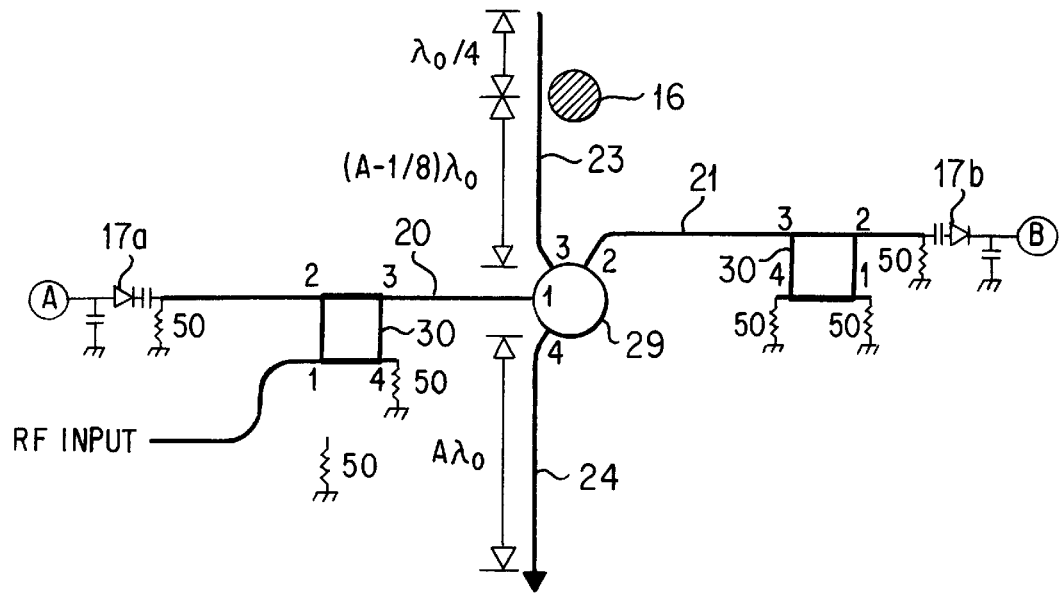
FIGS. 3a–3e show schematic diagrams of a circuit simplification process for the electronic circuit for a dielectric resonator frequency discriminator shown in FIG. 2.
Figure 3B:
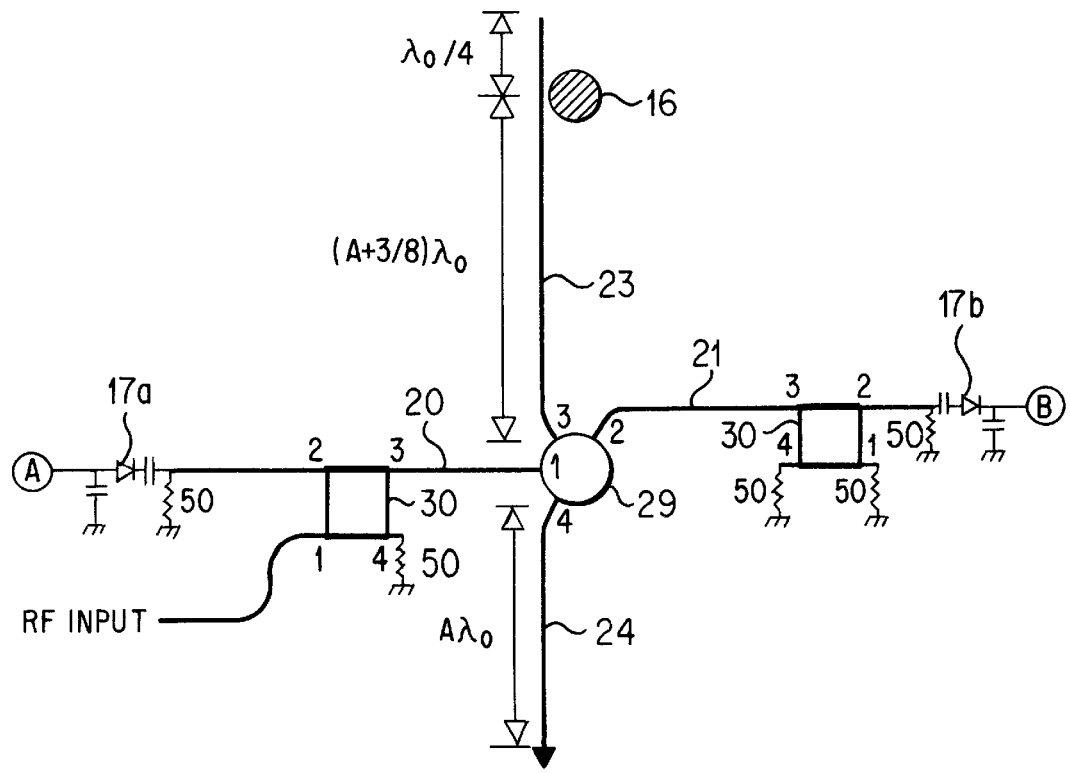
Figure 3C:
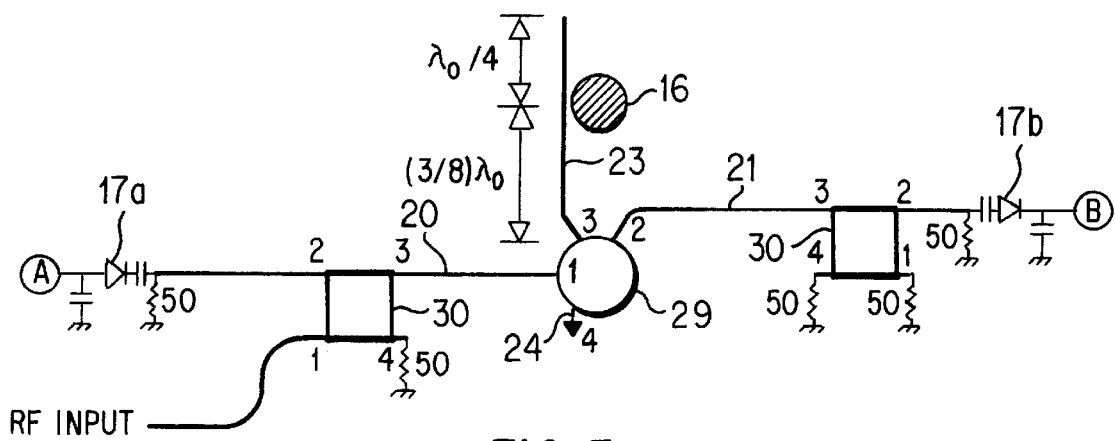
Figure 3D:
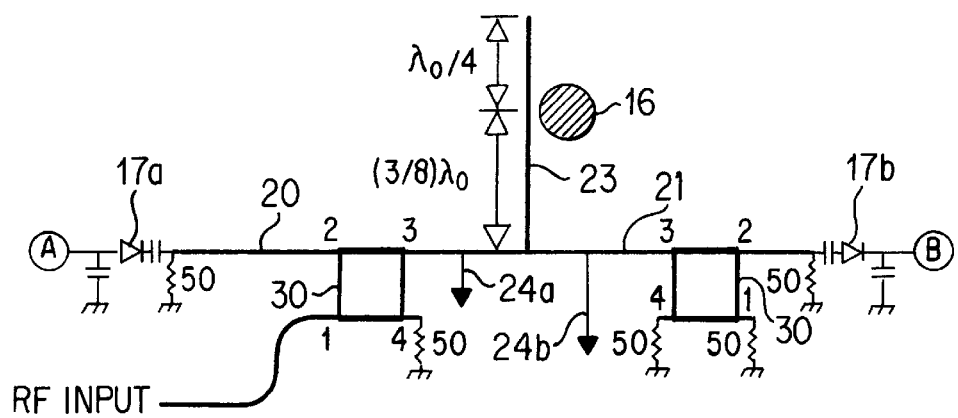
Figure 3E:
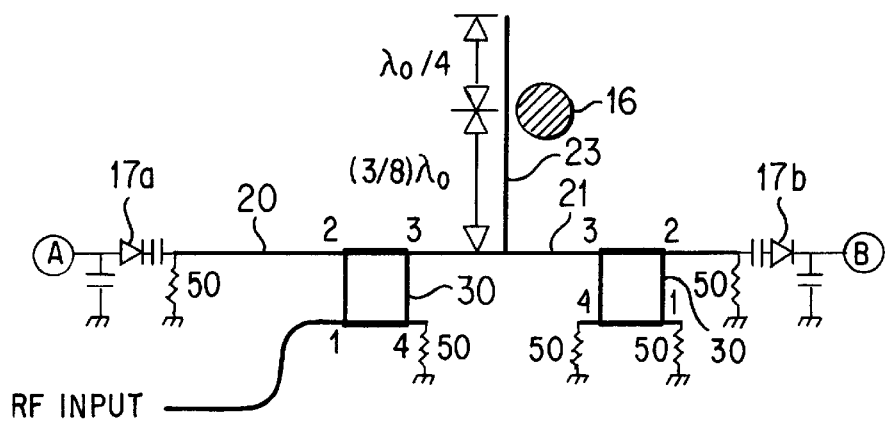

As a consequence of Equations 27 and 28 shown hereinabove, the length of resonator arm 23 coupled to single mode dielectric resonator 16 may be changed from $(A-\frac{1}{8})\lambda_0$ to $(A+\frac{3}{8})\lambda_0$ as can be seen in FIG. 3b. Because $V_{out}$ is not a function of "A" as shown by Equation 37, "A" is set to 0. Thus, short-circuited stub arm 24 of simplified circuit in accordance with one embodiment of this invention shown in FIG. 3e.

Figure 4:
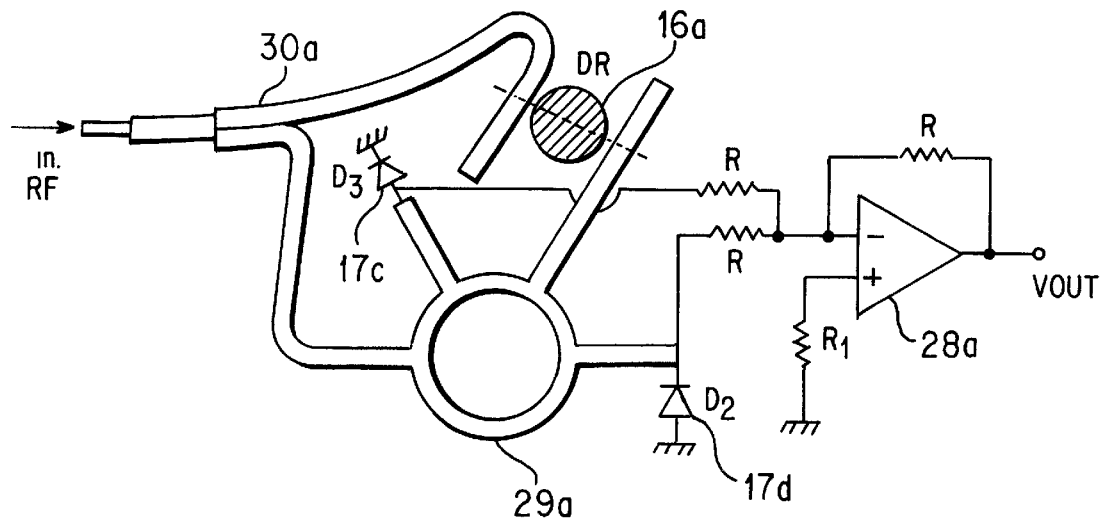
FIG. 4 is a schematic diagram of a dielectric resonator frequency discriminator employing a power divider and a ring-hybrid in accordance with one embodiment of this invention.
Figure 5:
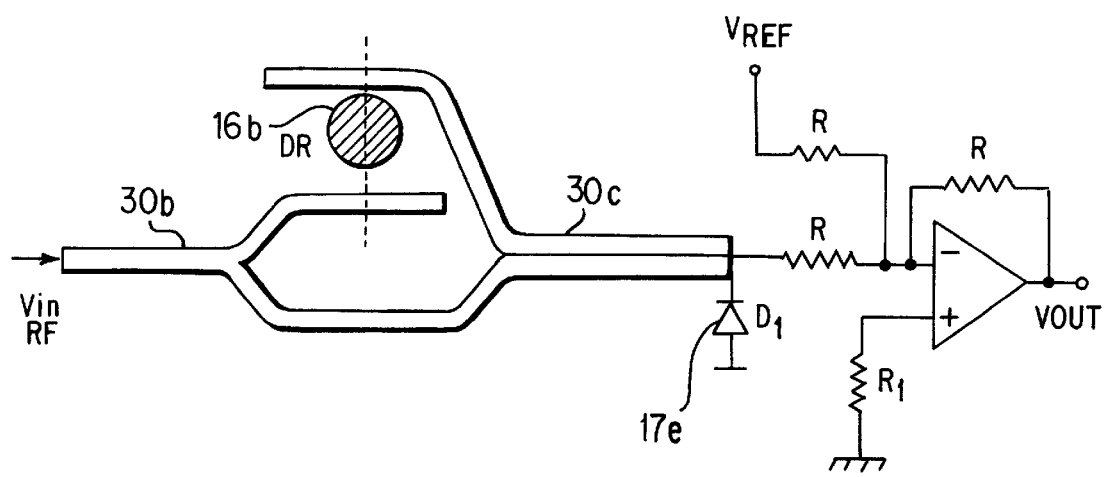
FIG. 5 is a schematic diagram of an electronic circuit for a branch-line dielectric resonator frequency discriminator in accordance with one embodiment of this invention.

FIGS. 4 and 5 show two additional embodiments of dielectric resonator frequency discriminators in accordance with this invention. In accordance with the embodiment shown in FIG. 4, a 3 dB coupler 30a is employed as a power divider and a hybrid ring 29a is employed to recombine the microwave signals after one of them has been phase-shifted by the dispersion action of the dielectric resonator 16a. The combined signals are each amplitude detected by a pair of matched diodes 17c, 17d and differentially superimposed to give the resulting output voltage, $V_{out}$. The summing is accomplished by a differential amplifier 28a. Typical sensitivity achieved was approximately 150 mV/1 MHz.

The circuit shown in FIG. 5 employs two 3 dB power dividers 30b, 30c to form a branch-line structure. A portion of the microwave signal undergoes additional phase shift in the dielectric resonator 16b and subsequently combines with the other at the output combiner. A single detector diode 17e is employed to envelope detect the combined signal, giving the S-curve characteristic at the output. Typical sensitivity was about 170 mV/MHz. While the branch-line circuit shown in FIG. 5 is more economical, the hybrid ring circuit shown in FIG. 4 has greater tolerance for variations in circuit parameters. However, both circuits are compact and can easily be integrated with other microstrip components in various microwave systems.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

We claim:

1. A dielectric resonator frequency discriminator comprising:
    a microstrip;
    a single-mode dielectric resonator coupled to said microstrip, said single-mode dielectric resonator functioning as a one-port element;
    at least one detector means for detecting an RF signal coupled to said microstrip; and
    RF input means for introducing an RF signal coupled to said microstrip.

2. A dielectric resonator frequency discriminator in accordance with claim 1, wherein said at least one detector means is one of a hot-carrier diode, a point contact diode and a high speed detector diode.

3. A dielectric resonator frequency discriminator in accordance with claim 1, wherein said microstrip is T-shaped, having a base leg and two arms, said single mode dielectric resonator is coupled to said base leg of said microstrip, and one of said at least one of said detector means is coupled to each of said two arms, said detector means being a matched set.

4. A dielectric resonator frequency discriminator in accordance with claim 3, wherein said single mode dielectric resonator is a high Q dielectric resonator.

5. A dielectric resonator frequency discriminator in accordance with claim 3, wherein each of said at least one of said detector means comprises at least one detector selected from the group consisting of a hot-carrier diode, a point contact diode, and a high speed detector diode.

6. A dielectric resonator frequency discriminator in accordance with claim 3, wherein one of said arms is a sum arm and the other of said arms is a difference arm.

7. A dielectric resonator frequency discriminator in accordance with claim 6, wherein said RF input means is coupled to said sum arm.

8. A dielectric resonator frequency discriminator in accordance with claim 1, wherein said micro strip comprises a hybrid junction having four side arms.

9. A dielectric resonator frequency discriminator in accordance with claim 8, wherein said four side arms comprise a sum arm a difference arm, a resonator arm and a short-circuited stab arm.

10. A dielectric resonator frequency discriminator in accordance with claim 9, wherein said single mode dielectric resonator is coupled to said resonator arm.

11. A dielectric resonator frequency discriminator in accordance with claim 10, wherein one of said at least one of said detector means is coupled to each of said sum arm and said difference arm.

12. A dielectric resonator frequency discriminator in accordance with claim 11, wherein said RF input means is coupled to said sum arm, injecting a signal into said sum arm, whereby said hybrid junction divides said signal into said resonator arm and said short-circuited stub arm, said resonator arm signal and said short-circuited stub arm signal are reflected back into said hybrid junction, the sum of the reflected signals is output to said sum arm, the difference of the reflected signals is output to the difference arm, and the sum and difference signals are detected by said at least one of said detector means and added together.

13. A dielectric resonator frequency discriminator in accordance with claim 8, wherein said four side arms comprise a sum arm a difference arm, a resonator arm and an RF input arm, said RF input arm comprising a power divider disposed between said RF input means and said hybrid junction, whereby said RF signal is split between an RF input arm branch and said resonator arm.

14. A dielectric resonator frequency discriminator in accordance with claim 13, wherein one of said at least one of said detector means is coupled to each of said sum arm and said difference arm.

15. A dielectric resonator frequency discriminator in accordance with claim 14, wherein said single mode dielectric resonator is coupled to said resonator arm and said RF input arm branch, whereby said RF signal in one of said resonator arm and said RF input arm branch is phase shifted by said single mode dielectric resonator and recombined with the other of said RF signals, and said combined signals are each amplitude detected by said at least one of said detector means and differentially superimposed to give an output voltage.

16. A dielectric resonator frequency discriminator in accordance with claim 15 further comprising a differential amplifier coupled to said sum arm and said difference arm, said differential amplifier summing said differentially superimposed RF signals.

17. A dielectric resonator frequency discriminator in accordance with claim 1, wherein said microstrip comprises two power dividers, a branch line extending from each of said power dividers, and said single mode dielectric resonator coupled to each of said branch lines, whereby a portion of said RF signal is phase-shifted in said single mode dielectric resonator and subsequently combines with a remaining portion of said RF signal, and said combined RF signal is envelope detected by said at least one of said detector means.

18. A dielectric resonator frequency discriminator comprising:
    a T-shaped microstrip having a base leg and two arms;
    a single mode dielectric resonator coupled to said base leg of said T-shaped microstrip and functioning as a one-port element; and
    at least one detector means for detecting an RF signal coupled to the end of each of said arms of said T-shaped microstrip.

19. An electronic circuit in accordance with claim 18, wherein said single mode dielectric resonator is a high Q dielectric resonator.

20. An electronic circuit in accordance with claim 18, wherein each of said at least one of said detector means comprises at least one detector selected from the group consisting of a hot-carrier diode, a point contact diode, and a high speed detector diode.

21. An electronic circuit in accordance with claim 18, wherein one of said arms is a sum arm and the other of said arms is a difference arm.

22. An electronic circuit in accordance with claim 21 further comprising RF input means for introducing an RF signal coupled to said sum arm of said T-shaped microstrip.

* * * * *